(12) United States Patent
Kondo et al.

(10) Patent No.: US 6,405,279 B1
(45) Date of Patent: Jun. 11, 2002

(54) APPARATUS AND METHOD FOR CONTROLLING REWRITING OF DATA INTO NONVOLATILE MEMORY

(75) Inventors: Haruhiko Kondo, Anjo; Hirokazu Komori, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/329,238

(22) Filed: Jun. 10, 1999

(30) Foreign Application Priority Data

Jul. 3, 1998 (JP) ............................... 10-189216

(51) Int. Cl.[7] ............................... G06F 12/00
(52) U.S. Cl. ................. 711/103; 711/154; 711/167
(58) Field of Search ................. 711/150, 155, 711/120, 143, 168, 103, 102, 154, 167, 169; 710/158, 168

(56) References Cited

U.S. PATENT DOCUMENTS

| | | | | |
|---|---|---|---|---|
| 5,193,153 A | * | 3/1993 | Soutoul | 395/250 |
| 5,386,553 A | * | 1/1995 | Fujita | 395/600 |
| 5,671,445 A | * | 9/1997 | Gluyas | 710/100 |
| 5,809,521 A | * | 9/1998 | Steinmetz | 711/116 |

FOREIGN PATENT DOCUMENTS

JP          5-189584          7/1993

* cited by examiner

*Primary Examiner*—Matthew Kim
*Assistant Examiner*—Christian P. Chace
(74) *Attorney, Agent, or Firm*—Nixon & Vanderhye PC

(57) ABSTRACT

In a data rewriting control apparatus, a receiving processing of storing data received from a memory rewriting device into a rotating type receiving data buffer in a RAM of a microcomputer is executed in parallel by the use of a time period required for a data writing processing in which the data is stored as writing data into a writing data buffer in the RAM and written into a flash ROM. Thus, the total time period of processing which includes a processing of receiving the data from the memory rewriting device and a processing of rewriting writing data into the flash ROM is shortened.

16 Claims, 6 Drawing Sheets

APPARATUS AND METHOD FOR CONTROLLING REWRITING OF DATA INTO NONVOLATILE MEMORY

CROSS REFERENCE TO RELATED APPLICATION

This application relates to and incorporates herein by reference Japanese Patent Application No. 10-189216 filed on Jul. 3, 1998.

BACKGROUND OF THE INVENTION

1. Field of the Invention

The present invention relates to an apparatus and method for controlling rewriting of data into a rewritable nonvolatile memory.

2. Description of Related Art

Electronic control apparatuses are known, which have a function of rewriting data into a rewritable nonvolatile memory through communications with an externally connected memory rewriting device. In one type, received data is rewritten as writing data at every data receiving. In another type such as disclosed in JP-A-5-189584, each writing data is stored first in a buffer to process a transmission request of all writing data to a memory rewriting device, and then rewriting is executed at a timing when a certain number of data are stored.

In the former type, as shown in FIG. 8A, a processing of receiving data 1, 2, 3, etc. from the memory rewriting device and a processing of rewriting those data as writing data 1, 2, 3, etc. are executed separately in alternation with respect to time. The sum of data receiving processing time period and data rewriting processing time period becomes a total processing time period required for an entire data rewriting operation. Further, as shown in FIG. 8B, the receiving processing of a plurality of data 1, 2, 3, etc. and the rewriting processing of writing those data as the writing data 1, 2, 3, etc. are executed separately in alternation with respect to time. In this instance also, the sum of the receiving processing time period and the rewriting processing time period becomes a total processing time period required for an entire rewriting operation.

That is, the conventional processing of rewriting of data into a rewritable nonvolatile memory, for instance a flash ROM, is executed as shown in FIG. 9.

More specifically, at step S1 in FIG. 9, it is checked whether a received data exists in a buffer. If the check result at step S1 is NO, the processing proceeds to step S2 only after waiting until a data is received. At step S2, a communication interruption command is transmitted to the memory rewriting device because a data can not be received from the memory rewriting device during the execution of data rewriting processing. At next step S3, writing of the received data into the flash ROM is started as shown in FIG. 10. At next step S4, the processing does not proceed until a completion of data writing when the data writing into the flash ROM is being executed as shown in FIG. 10.

Then at step S5, a verification of the written data is executed to confirm the completion of writing of data into the flash ROM as shown in FIG. 10. It is checked whether the verification result is indicative of completion of writing the received data. This verification is executed to check correctness of the data written into a medium by reading out from the flash ROM the data written into the flash ROM and comparing those with the received data stored in the buffer. If the check result at step S5 is NO, that is, the verification result is not indicative of completion of writing the received data, the processing returns to step S2 so that the above processing may be repeated in the similar manner.

If the check result at step S5 is YES, that is the verification result of the written data is OK, it is determined that the writing into the flash ROM has been completed and the processing proceeds to step S6. At step S6, a communication restart command is transmitted to the memory rewriting device to enable receiving of further data from the memory rewriting device. At next step S7, it is checked whether writing of all writing data has been completed. If the check result at step S7 is NO, that is, the writing of all writing data has not been completed yet, the processing returns to step S1, so that the above processing may be repeated in the similar manner. If the check result at step S700 is YES, that is, the writing of all data has been completed, a request for calculating a check sum of the rewritten data is issued without fail. The completion of writing all writing data is determined based on this request, thus ending this routine.

In the above flash ROM writing wait time period at step S4, as shown in FIG. 10, the processing is in a wait condition. During this time period, no actual processing is executed because of loop processing and the like. Further, it is unavoidable to interrupt temporarily the communication with the memory rewriting device, because data from the memory rewriting device can not be received during the execution of the data writing processing. As a result, it is impossible to shorten the sum of receiving processing time period and the rewriting processing time period.

SUMMARY OF THE INVENTION

The present invention has an object to obviate the above disadvantage.

The present invention has another object to provide an apparatus and method which is capable of shortening a total time period of a processing of receiving data from an outside and a processing of rewriting of received data into a rewritable nonvolatile memory.

According to the present invention, a receiving processing of storing data received from an outside in a first storage area and a processing of storing the received data in a second storage area as writing data and writing those into a rewritable nonvolatile memory are executed in parallel. Thus, a total time period of the processing of receiving the data from the outside and the processing of rewriting those into the rewritable nonvolatile memory can be shortened.

Preferably, the first storage area is provided by a rotating type buffer. Therefore, even if a number of data are stored in the first storage area in excess of an allowable size, it is not necessitated to shift the remaining data to its top in the first storage area.

More preferably, the first storage area and the second storage area are provided separately by a receiving data buffer and a writing data buffer. By using those buffers alternately at every rewriting operation, the, processing of receiving data from the outside and the processing of rewriting the received data into the rewritable nonvolatile memory can be executed at the same time.

BRIEF DESCRIPTION OF THE DRAWINGS

Other objects, features and advantages of the present invention will become more apparent from the following detailed description made with reference to the accompanying drawings. In the drawings.

DETAILED DESCRIPTION OF THE PREFERRED EMBODIMENT

The present invention is described in further detail with reference to one embodiment, in which a data rewriting control apparatus is applied to an internal combustion engine control system mounted on a vehicle.

Figure 1:
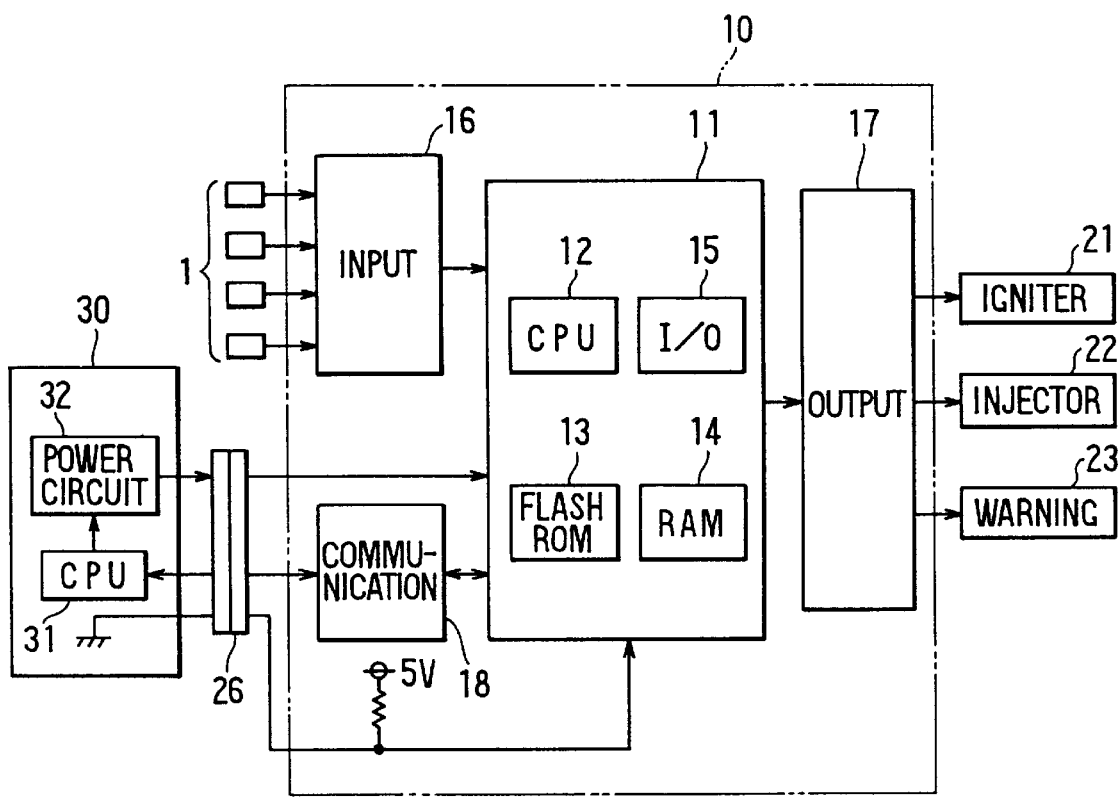
FIG. 1 is a block diagram showing an entire construction of an ECU mounted on a vehicle, to which a data rewriting control apparatus according to an embodiment of the present invention is applied.

In FIG. 1 the control apparatus comprises an electronic control unit (ECU) 10 for an internal combustion engine (not shown). Sensor signals of various types of sensors 1, which sense operating conditions of the internal combustion engine, are applied to the ECU 10. The sensor signals from those sensors 1 are waveform-shaped and A/D-converted by an input circuit 16 in the ECU 10, and applied to a microcomputer 11. The microcomputer 11 calculates optimum control amounts for the internal combustion engine based on the sensor signals from the input circuit 16. Control signals indicative of the calculation results are applied to an output circuit 17. Actuators such as an igniter 21, injectors (fuel injection valves) 22 and the like of the internal combustion engine are driven by the control signals from the output circuit 17. Various warning lights 23 are lit when required. The ECU 10 has a communication circuit 18 for data communications. with a memory rewriting device 30, which is to be connected through. a coupling connector 26 at the time of rewriting an internal combustion engine control program and control data in the microcomputer 11.

The microcomputer 11 is constructed as a logic arithmetic circuit, which comprises a central processing unit (CPU) 12, a flash ROM 13 which stores the control program and data, a RAM 14 which stores various data, an input-output (I/O) circuit 15 which receives signals from the input circuit 16, communication circuit 18, etc. and outputs the control signals to the output circuit 17, a bus line which connects those circuits, and the like. The flash ROM 13 is a memory which is capable of erasing the program and data once written and rewriting the same, that is, a rewritable read only memory which is nonvolatile. An EEPROM, etc. may be used alternatively as the rewritable nonvolatile memory.

Further, the memory rewriting device 30 as an externally connectable device primarily comprises a CPU 31 and an electric power circuit 32. The CPU 31 is for serial communications with the microcomputer 11 of the ECU 10 thereby to rewrite the control program and data stored in the flash ROM of the microcomputer 11. The power circuit 32 is controlled by the CPU 31 and for supplying a high voltage required at the time of rewriting the flash ROM 13 within the microcomputer 11 of the ECU 10. That is, serial communications are enabled between the memory rewriting device 30 and the microcomputer 11 of the ECU 10, when the memory rewriting device 30 is connected to the communication circuit 18 of the ECU 10.

Figure 2:
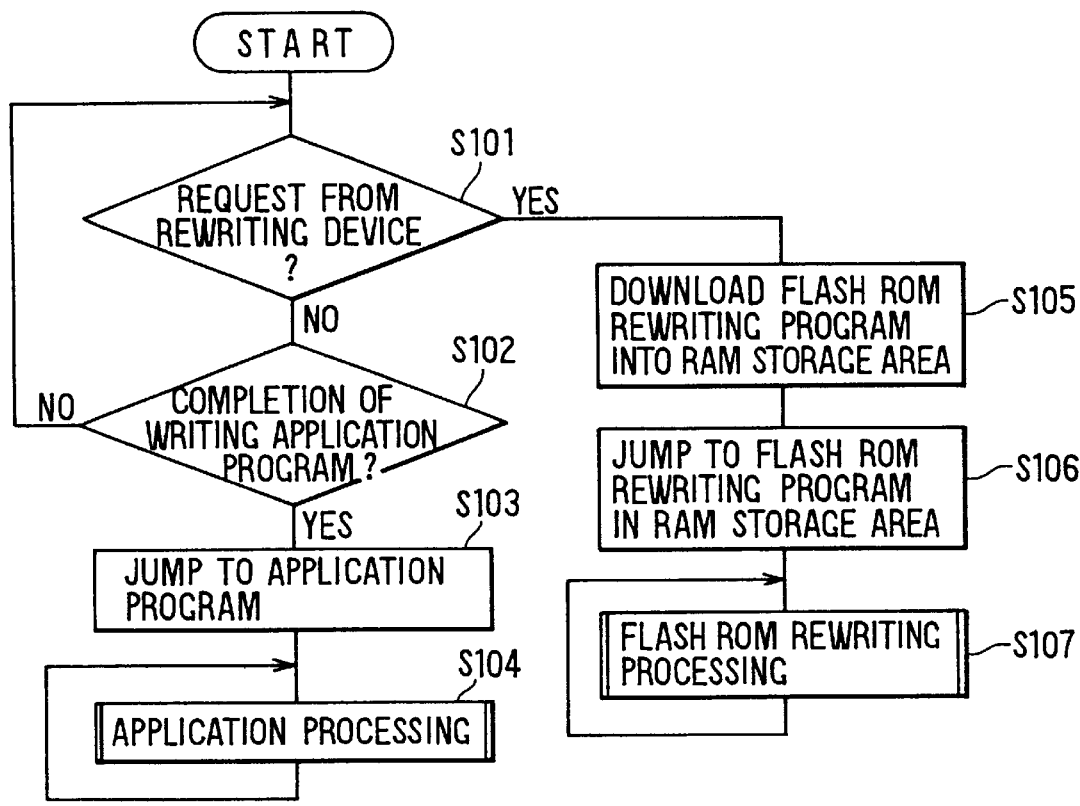
FIG. 2 is a flow diagram showing an entire processing of a CPU in a microcomputer used in the control apparatus according to the embodiment of the present invention.

Next, the entire processing of the CPU 12 in the microcomputer 11 is described based on a flow diagram shown in FIG. 2. This control routine is executed repeatedly by the CPU 12 at every predetermined resetting.

In FIG. 2, it is checked first at step S101 whether a program rewriting request is issued from the memory rewriting device 30. If the memory rewriting device 30 is not connected to the ECU 10 through the connector 26 resulting in no program rewriting request, the processing proceeds to step S102 and checks whether an application program has been already written into the flash ROM 13. This checking is for preventing jumping to an application processing when the application program has not been written into the flash ROM 13. If the check result at step S102 is YES, that is, the application program has been already written into the flash ROM 13, the processing proceeds to step S103 to jump to the application program. At next step S104, the application processing is executed, so that the internal combustion engine control such as an ignition timing control for the igniter 21, fuel injection amount control for the injectors 22 and the like may be performed.

If the check result at step S102 is NO, that is, the application program has not been written into the flash ROM 13, the processing returns to step S101. The processing proceeds to step S105 after waiting until the memory rewriting device 30 is connected to the ECU 10 through the connector 26 and the program rewriting request is received from the memory rewriting device 30. At step S105, a flash ROM rewriting program received from the memory rewriting device 30 is downloaded into a storage area of the RAM 14. Next, at step S106, the processing jumps to the flash ROM rewriting program downloaded into the RAM 14. At the following step S107, the following flash ROM rewriting processing is executed.

Construction of a rotating type receiving data buffer and a writing data buffer, which are provided in the RAM 14 in the microcomputer 11 of the ECU 10 for storing the data received from the memory rewriting device 30, is described next with reference to FIG. 3.

According to this embodiment, the receiving data buffer is formed of a rotating type buffer. In the case that the receiving data buffer is formed of a normal buffer, if too much data in excess of size of copying from the receiving data buffer into the writing data buffer are stored in the receiving data buffer, data which have not been copied or written into the writing data buffer previously and remains in the receiving data buffer must be shifted to its top. That is, this shifting of the data in the receiving data buffer is for preventing data overflow. In this embodiment, the rotating type receiving data buffer is used as the receiving data buffer thereby to eliminate the above shifting processing. Here, it is noted that the receiving data buffer may be a normal buffer.

Figure 3:
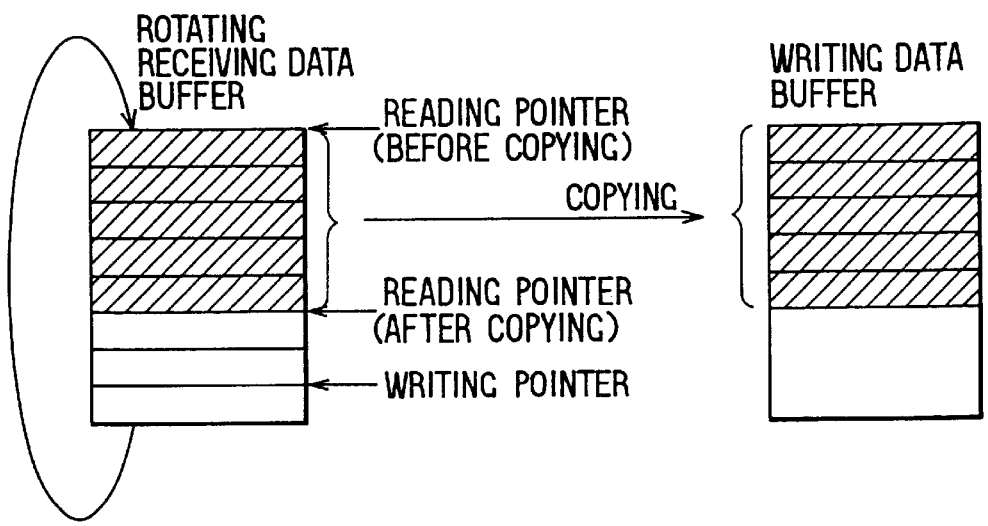
FIG. 3 is an explanatory view showing a rotating type receiving data buffer and a writing data buffer in a RAM of the microcomputer used in the control apparatus according to the embodiment of the present invention.

As shown in FIG. 3, in the rotating type receiving data buffer, the reading pointer is returned to the top upon reaching the end. Therefore, a buffer which does not have the overflow problem can be provided. Further, the processing of reading from the rotating type receiving data buffer and the processing of writing into the rotating type writing data buffer can be executed separately, provided that the reading pointer of the rotating type receiving data buffer and the writing pointer of the rotating type receiving data buffer are provided separately.

Here, the reading pointer indicates a location in the rotating type receiving data buffer from which the data is read out. This reading pointer is incremented by an amount corresponding to the size of data read out, for instance by an amount "5" in FIG. 3, when data are read out. Further, the writing pointer indicates a location in the rotating type buffer into which the data is written. This writing pointer is incremented by an amount corresponding to the size of written data when data are written.

Figure 4:
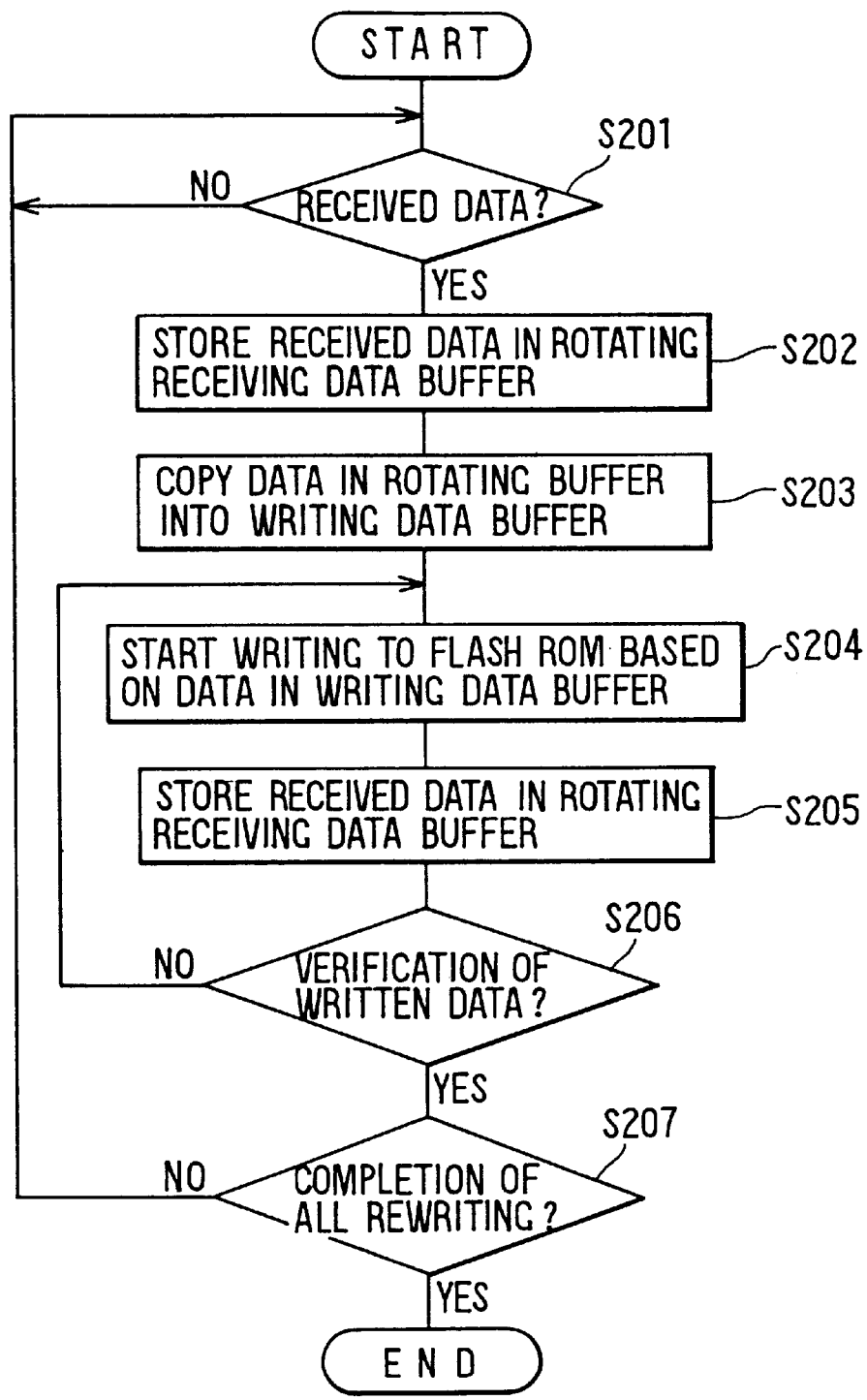
FIG. 4 is a flow diagram showing a processing of a flash ROM rewriting of the CPU in the microcomputer used in the control apparatus according to the embodiment of the present invention.

The flash ROM rewriting processing by the CPU 12 in the microcomputer 11 is described with reference to FIG. 4.

That is, it is checked first at step S201 whether received data exists. If the check result at step S201 is NO, the processing proceeds to step S202 after waiting for the first data to be received. At step S202, the received data is stored in the rotating type receiving data buffer. At the next step S203, the data in the rotating type receiving data buffer not processed yet is copied into the writing data buffer.

Figure 5:
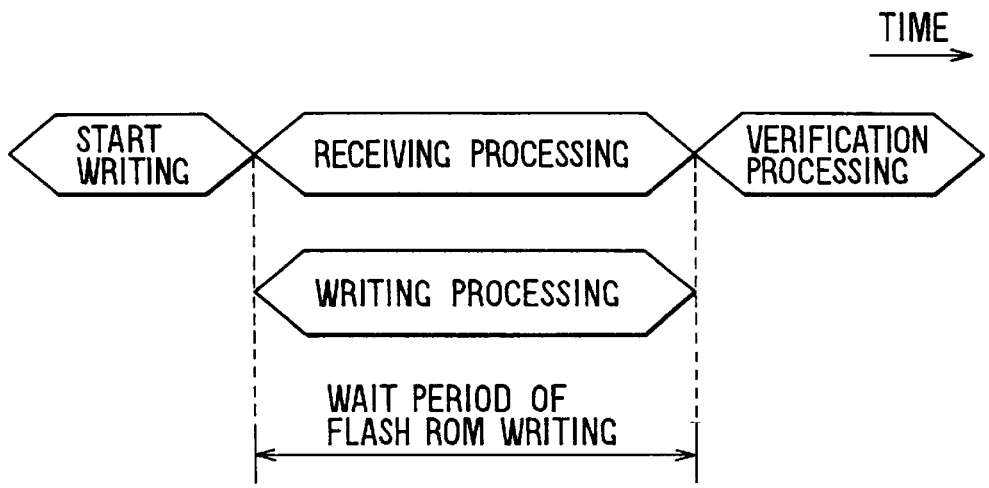
FIG. 5 is a timing diagram showing processing timings at the time of flash ROM rewriting of the CPU in the microcomputer used in the control apparatus according to the embodiment of the present invention.

Then at step S204, data writing into the flash ROM 13 is initiated as shown in FIG. 5 based on the data in the writing data buffer. At the next step S205, as shown in FIG. 5, the received data are stored in the rotating type buffer by using the wait time period. At next step S206, verification of the written data is executed as shown in FIG. 5 to confirm a completion of writing, so that the verification result may be checked. If the check result at step S206 is NO, that is, the verification result of the written data is not good, the processing returns to step S204 to repeat the above processing in the similar manner.

If the check result at step S206 is YES, that is, the verification result of the written data is good, the CPU 12 determines the completion of writing of data into the flash ROM 13 and proceeds to step S207. At step S207, it is checked whether rewriting of all the writing data has been completed. If the check result at step S207 is NO, that is, the rewriting of all the writing data has not been completed yet, the processing returns to step S201 to repeat the above processing. If the check result at step S207 is YES, that is, after writing of all the writing data has been completed, a request for calculating a check sum of the rewritten data is issued. It is determined based on the issuance of this request that the writing of all the writing data has been completed, thus ending this routine.

As described above, according to the present embodiment, as shown in FIG. 5, the receiving processing of the receiving data is executed during the writing wait time period of the flash ROM 13 in the writing processing.

Figure 6:
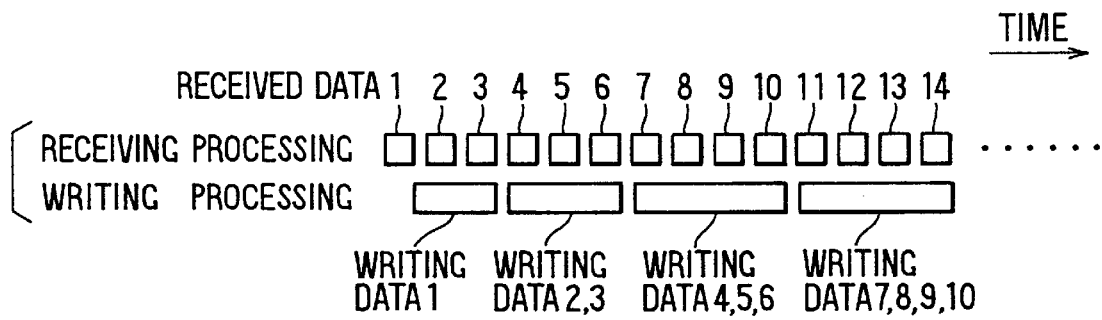
FIG. 6 is a timing diagram showing a relation of processing time periods between the receiving processing of receiving data and the rewriting processing in the control apparatus according to the embodiment of the present invention.

Thus, as shown in the timing diagram of FIG. 6, the processing of receiving the data 1, 2, 3, etc. from the memory rewriting device 30 and the processing of rewriting those data as the writing data 1, 2, 3, etc. are executed in parallel concurrently. As a result, the total processing time period which equals the sum of time periods of the data receiving processing and the data rewriting processing can be shortened.

Thus, the ECU 10 has the receiving data buffer in the RAM 14 as the first storage area for receiving the data to be rewritten into the flash ROM 13 from outside and storing therein the received data, and the writing data buffer in the RAM 14 as the second storage area. The writing data buffer is provided separately in the RAM 14 for storing the data stored in the receiving data buffer of the RAM 14 as the writing data to be written into the flash ROM 13. The processing of receiving the data for the receiving data buffer in the RAM 14 and the processing of writing the writing data stored in the writing data buffer in the RAM 14 into the flash ROM 13 are executed in parallel. Further, the receiving data buffer as the first storage area of the ECU 10 is provided by the rotating type receiving data buffer. That is, the processing of receiving the data for the rotating type buffer of the RAM 14 is executed in parallel by the use of the time period required for the processing of writing the writing data of the writing buffer of the RAM 14 into the flash ROM 13. Thus, the total time period which includes the processing of receiving the data from the memory rewriting device 30 and the processing of rewriting the writing data into the flash ROM 13 can be shortened.

Figure 7:
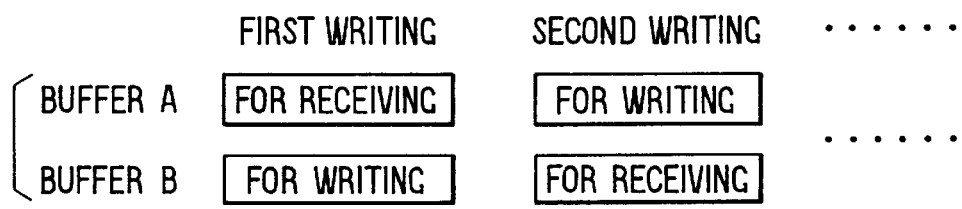
FIG. 7 is an explanatory view showing a modification of a buffer construction in the control apparatus according to the embodiment of the present invention.
Figure 8A:
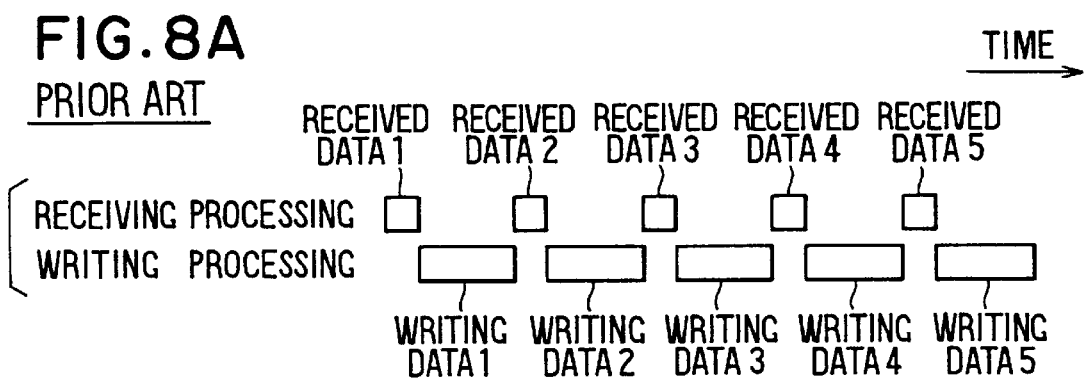
FIGS. 8A and 8B are timing diagrams showing relations of processing time periods between a receiving processing of receiving data and a rewriting processing in a conventional data rewriting control apparatus.
Figure 8B:
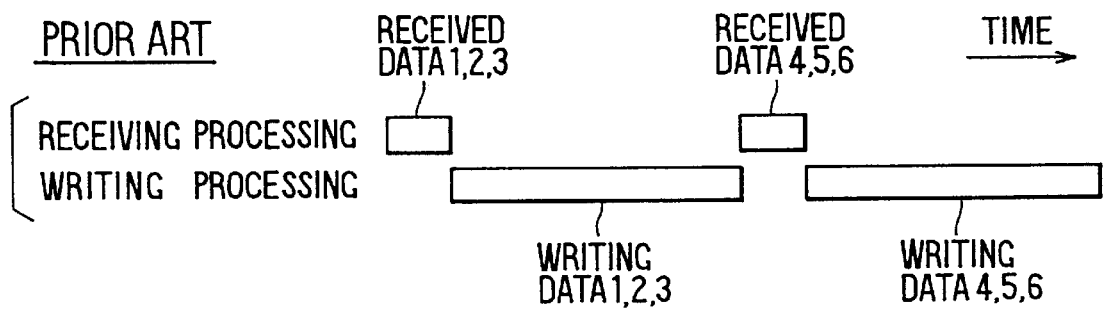
Figure 9:
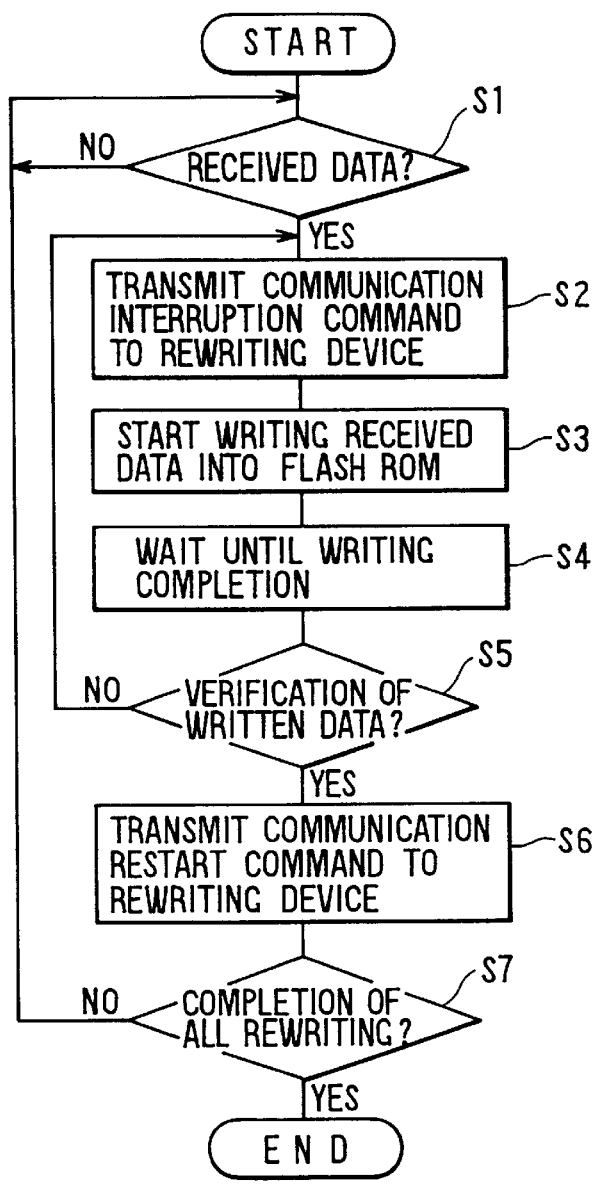
FIG. 9 is a flow diagram showing a processing of a flash ROM rewriting processing in the conventional control apparatus.
Figure 10:
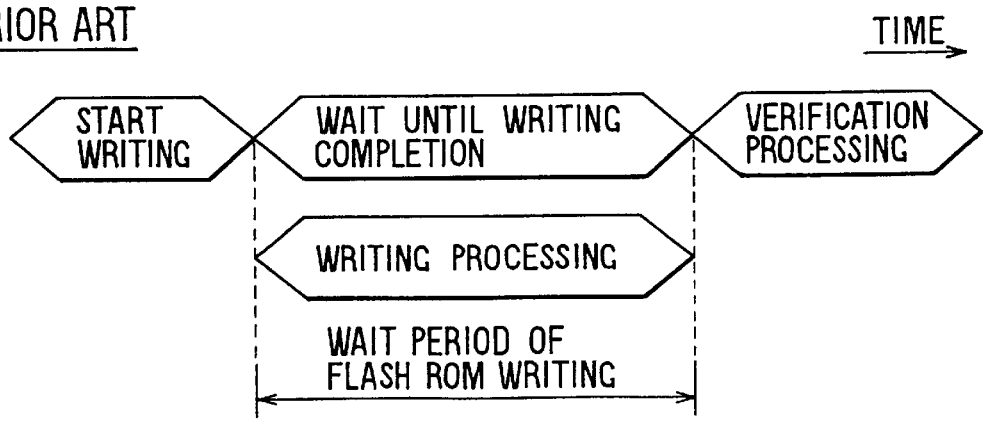
FIG. 10 is a timing diagram showing processing timings at the time of flash ROM rewriting in the conventional control apparatus.

The above embodiment may be modified as shown in FIG. 7. That is, a buffer A and a buffer B may be used independently of each other, so that one and the other of those buffers are switched to function as a receiving data buffer and a writing data buffer respectively. As the buffer A and the buffer B are used alternately at every data rewriting operation, the processing of receiving the data from the memory rewriting device 30 and the processing of rewriting the received data into the flash ROM can be executed in parallel at the same time.

The embodiment may be modified further without departing from the spirit of the invention.

What is claimed is:

1. An apparatus for controlling a predetermined control object based on data stored in a rewritable nonvolatile memory comprising:

a first storage area for receiving, from an outside device separate from the apparatus and storing therein data to be written into the nonvolatile memory; and a second storage area provided separately from the first storage area for storing the data stored in the first storage area as writing data to be written into the nonvolatile memory, wherein a process of receiving the data in the first storage area is executed a plurality of times in parallel with and during a period of a process of writing into the nonvolatile memory the writing data stored in the second storage area, and the period of the process of writing is initiated after a first execution of the process of receiving data in the first storage area is completed but before the next execution of the process of receiving data in the first storage area has begun.

2. An apparatus as in claim 1, wherein the first storage area is provided by a rotating type buffer.

3. An apparatus as in claim 1, wherein the first storage area and the second storage area are provided separately by buffers.

4. An apparatus as in claim 1, wherein the data to be rewritten is a control program of an internal combustion engine.

5. A method for controlling data rewriting in a control apparatus comprising:
   a step of receiving data to be rewritten from an outside device separate from the control apparatus;
   a step of storing the received data in a first storage area; and
   a step of rewriting the stored data into a nonvolatile memory,
   wherein the receiving step is executed a plurality of times in parallel with and during a period of the rewriting step while copying the stored data in the first storage area into a second storage area separately provided from the first storage area, and the rewriting step is initiated after a first execution of the receiving step has completed but before the next execution of the receiving step has begun.

6. A method for controlling data rewriting in a control apparatus comprising:
   a step of receiving data to be rewritten from an outside device separate from the control apparatus;
   a step of storing the received data in a first storage area; and
   a step of rewriting the stored data into a nonvolatile memory,
   wherein the receiving step is executed a plurality of times in parallel with and during a period of the rewriting step while receiving another data from the outside and storing the received another data in a second storage area provided separately from the first storage area, and the rewriting step is initiated after a first execution of the receiving step has completed but before the next execution of the receiving step has begun.

7. An apparatus for controlling a predetermined control object based on data stored in a rewritable nonvolatile memory, comprising:
   a first storage area for receiving from an outside device separate from the apparatus and storing therein a group of data to be written into the nonvolatile memory;
   a second storage area provided separately from the first storage area for storing the group of data stored in the first storage area as writing data to be written into the nonvolatile memory; and
   a controller for executing in parallel process of receiving the group of data in the first storage area and a process of writing into the nonvolatile memory the writing data stored in the second storage area,
   wherein the controller starts storing another group of data from the outside device in the first storage area in response to a start of writing the group of data in the second storage area into the nonvolatile memory, and the process of writing into the nonvolatile memory begins after a process of receiving the group of data in the first storage area is completed but before a process of receiving the another group of data in the first storage area begins.

8. An apparatus for controlling a predetermined control object based on data stored in a rewritable nonvolatile memory comprising:
   a first storage area for receiving from an outside device separate from the first storage area and storing therein data to be written into the nonvolatile memory; and
   a second storage area provided separately from the first storage area for storing the data stored in the first storage area as writing data to be written into the nonvolatile memory,
   wherein a process of receiving the data in the first storage area is executed a plurality of times in parallel with and during a period of a process of writing into the nonvolatile memory the writing data stored in the second storage area, the process of writing into the nonvolatile memory the writing data stored in the second storage area is repeated following a completion of a preceding process of writing into the nonvolatile memory without a delay resulting from a predetermined amount of data being required to be stored in the second storage area, and the period of the process of writing is initiated after a first execution of the process of receiving data in the first storage area is completed but before the next execution of the process of receiving data in the first storage area has begun.

9. A method for controlling data rewriting in a control apparatus comprising:
   a step of receiving data to be rewritten from an outside device separate from the control apparatus;
   a step of storing the received data in a first storage area; and
   a step of rewriting the stored data into a nonvolatile memory,
   wherein the receiving step is executed a plurality of times in parallel with and during a period of the rewriting step while copying the stored data in the first storage area into a second storage area separately provided from the first storage area, and writing into the nonvolatile memory the stored data in the second storage area is repeated following a completion of a preceding process of writing into the nonvolatile memory without a delay resulting from a predetermined amount of data being required to be stored in the second storage area, and the rewriting step is initiated after a first execution of the receiving step has completed but before the next execution of the receiving step has begun.

10. An apparatus for controlling a predetermined control object based on data stored in a rewritable nonvolatile memory comprising:
    a first storage area for receiving from an outside device separate from the first storage area and storing therein data to be written into the nonvolatile memory; and
    a second storage area provided separately from the first storage area for storing the data stored in the first storage area as writing data to be written into the nonvolatile memory,
    wherein a process of receiving the data in the first storage area is executed a plurality of times in parallel with and during a period of a process of writing into the nonvolatile memory the writing data stored in the second storage area, the process of writing into the nonvolatile memory the writing data stored in the second storage area being executed a plurality of times using a same data path, and the period of the process of writing is initiated after a first execution of the process of receiving data in the first storage area is completed but before the next execution of the process of receiving data in the first storage area has begun.

11. A method for controlling data rewriting in a control apparatus comprising:
    a step of receiving data to be rewritten from an outside device separate from the control apparatus;
    a step of storing the received data in a first storage area; and
    a step of rewriting the stored data into a nonvolatile memory, wherein the receiving step is executed a plurality of times in parallel with and during a period of the rewriting step while copying the stored data in the first storage area into a second storage area separately provided from the first storage area, and writing into the nonvolatile memory the data stored in the second storage area is executed a plurality of times using a same data path, and the rewriting step is initiated after a first execution of the receiving step has completed but before the next execution of the receiving step has begun.

12. An apparatus for controlling a predetermined control object based on data stored in a rewritable nonvolatile memory comprising:

a first storage area for receiving from an outside device separate from the first storage area and storing therein first and second groups of data to be written into the nonvolatile memory during a first and second reception processes, respectively; and a second storage area provided separately from the first storage area for storing the first and second groups of data stored in the first storage area as writing data to be written into the nonvolatile memory, wherein additional data reception processes for receiving additional groups of data in the first storage area are executed in parallel with and during a period of a process of writing into the nonvolatile memory the writing data stored in the second storage area, the process of writing into the nonvolatile memory the writing data stored in the second storage area including writing the first and second groups of data into the nonvolatile memory.

13. A method for controlling data rewriting comprising:

a step of receiving first and second groups of data during first and second data a receiving processes, respectively;

a step o f storing the received first a and second groups of data in a first storage area; and a step of rewriting the stored first and second groups of data into a nonvolatile memory, wherein the receiving step is executed a plurality of additional times to receive a plurality of additional groups of data in parallel with and during a period of the rewriting step while copying the stored data in the first storage area into a second storage area separately provided from the first storage area.

14. A method of controlling a rewriting operation of a vehicle control program stored in a nonvolatile memory of an electronic control apparatus in a vehicle, the method comprising:

connecting a rewriting device to the electronic control apparatus;

transferring a series of data of a new vehicle control program from the rewriting device to the electronic control apparatus, the series of data being for replacement of an original vehicle control program stored in the nonvolatile memory;

temporarily storing the series of data in a volatile memory in the electronic control apparatus;

transferring the series of data from the volatile memory to the nonvolatile memory concurrently with transferring the series of data from the rewriting device; and rewriting the new vehicle control program in the nonvolatile memory in place of the original vehicle control program;

wherein the rewriting is initiated after a first data of the series of data is transferred and stored in the volatile memory and before a second data of the series of data is transferred and stored in the volatile memory.

15. A method as in claim 14, wherein the temporarily storing of the series of data includes storing the series of data in a first storage area of the volatile memory and copying the series of data one by one from the first storage area to a second storage area of the volatile memory different from the first storage area each time the series of data is transferred to the nonvolatile memory one by one.

16. A method as in claim 15, wherein all of the series of data stored in the second storage area of the volatile memory during a previous rewriting are transferred to the nonvolatile memory in a next rewriting.

* * * * *